(12) United States Patent
Mengel et al.

(10) Patent No.: US 9,984,897 B2
(45) Date of Patent: May 29, 2018

(54) METHOD FOR MANUFACTURING A CHIP ARRANGEMENT INCLUDING A CERAMIC LAYER

(71) Applicant: Infineon Technologies AG, Neubiberg (DE)

(72) Inventors: Manfred Mengel, Bad Abbach (DE); Joachim Mahler, Regensburg (DE); Khalil Hosseini, Weihmichl (DE); Franz-Peter Kalz, Regensburg (DE)

(73) Assignee: INFINEON TECHNOLOGIES AG, Neubiberg (DE)

( * ) Notice: Subject to any disclaimer, the term of this patent is extended or adjusted under 35 U.S.C. 154(b) by 0 days. days.

(21) Appl. No.: 15/268,674

(22) Filed: Sep. 19, 2016

(65) Prior Publication Data

US 2017/0004979 A1 Jan. 5, 2017

Related U.S. Application Data

(62) Division of application No. 13/742,455, filed on Jan. 16, 2013, now abandoned.

(51) Int. Cl.
*H01L 21/48* (2006.01)
*H01L 23/373* (2006.01)
(Continued)

(52) U.S. Cl.
CPC ...... *H01L 21/4807* (2013.01); *H01L 21/4825* (2013.01); *H01L 21/56* (2013.01); *H01L 21/77* (2013.01); *H01L 23/3731* (2013.01); *H01L 23/3735* (2013.01); *H01L 23/49562* (2013.01); *H01L 23/49575* (2013.01); *H01L 23/49586* (2013.01); *H01L 24/27* (2013.01); *H01L 24/743* (2013.01); *H01L 25/50* (2013.01); *H01L 2224/32225* (2013.01); *H01L 2224/32245* (2013.01); *H01L 2224/48091* (2013.01); *H01L 2224/48145* (2013.01); *H01L 2224/48247* (2013.01); *H01L 2224/48465* (2013.01); *H01L 2224/48472* (2013.01); *H01L 2224/49111* (2013.01); *H01L 2224/73265* (2013.01); *H01L 2224/83192* (2013.01); *H01L 2224/92247* (2013.01); *H01L 2924/07802* (2013.01); *H01L 2924/12032* (2013.01); *H01L 2924/1301* (2013.01); *H01L 2924/1305* (2013.01); *H01L 2924/1306* (2013.01); (Continued)

(58) Field of Classification Search
CPC ............. H01L 21/4807; H01L 21/4825; H01L 23/3731; H01L 23/3735
See application file for complete search history.

(56) References Cited

U.S. PATENT DOCUMENTS 7,868,465 B2 * 1/2011 Otremba ........... H01L 23/49513
257/676
2013/0229777 A1 * 9/2013 Otremba ................ H01L 23/291
361/783

OTHER PUBLICATIONS http://mit.imt.si/Revija/izvodi/mit121/drenik.pdf, accepted for publication Aug. 3, 2011.*

* cited by examiner

*Primary Examiner* — Thien F Tran
(74) *Attorney, Agent, or Firm* — Viering, Jentschura & Partner MBB

(57) ABSTRACT

A chip arrangement is provided, the chip arrangement, including a carrier; a first chip electrically connected to the carrier; a ceramic layer disposed over the carrier; and a second chip disposed over the ceramic layer; wherein the ceramic layer has a porosity in the range from about 3% to about 70%.

19 Claims, 8 Drawing Sheets

(51) Int. Cl.
*H01L 21/77* (2017.01)
*H01L 23/495* (2006.01)
*H01L 23/00* (2006.01)
*H01L 21/56* (2006.01)
*H01L 25/00* (2006.01)

(52) U.S. Cl.
CPC ............... *H01L 2924/13034* (2013.01); *H01L 2924/13091* (2013.01); *H01L 2924/181* (2013.01)

Prior Art
FIG 2A
FIG 2B
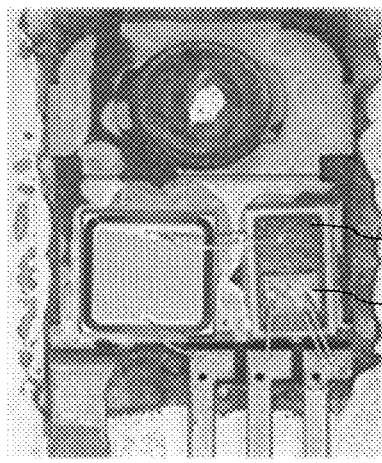
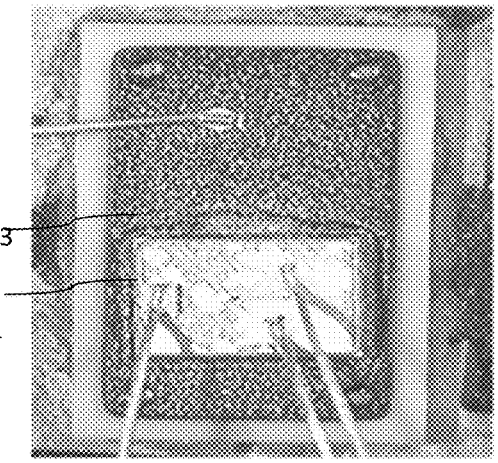
Power chip 103
Logic chip 101
FIG 2C
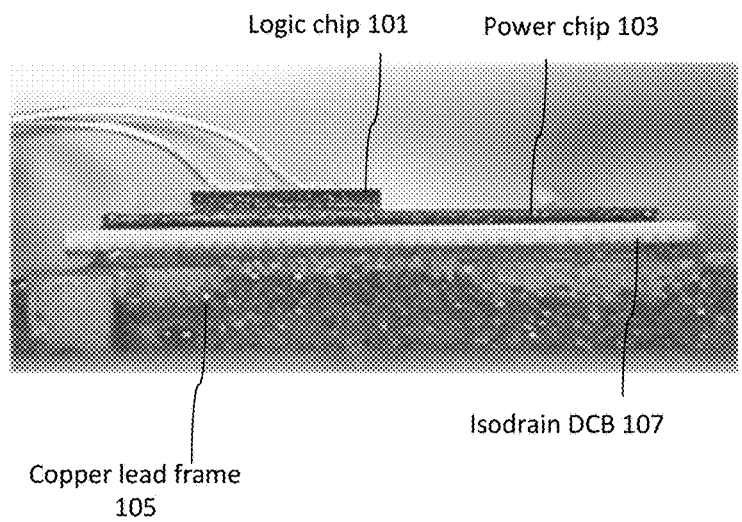
Logic chip 101     Power chip 103
Copper lead frame 105
Isodrain DCB 107

METHOD FOR MANUFACTURING A CHIP ARRANGEMENT INCLUDING A CERAMIC LAYER

CROSS-REFERENCE TO RELATED APPLICATION

This application is a Divisional of U.S. patent application Ser. No. 13/742,455, filed Jan. 16, 2013, which is incorporated herein by reference.

TECHNICAL FIELD

Various embodiments relate generally to a chip arrangement and a method for manufacturing a chip arrangement.

BACKGROUND

Various electronic applications and chip packages may include more than one semiconductor chip. Such applications may include a leadframe, which may carry a chip such as a power semiconductor chip, and it may be necessary that a further chip, e.g. a controller chip may be electrically isolated from the leadframe. Chip adhesion materials, which may be used for electrical insulation, and which may include electrically insulating materials, e.g. an electrically insulating glue, may possess some required general thermomechanical mechanical properties, however they may not exhibit sufficient heat dissipation to enable sufficiently large losses of heat to be removed from the electronic circuit. It is desirable for heat to be dissipated efficiently from the chips and away from the lead frame. Other desirable characteristics which are not being met by current techniques include being able to place precisely, electrically insulating isolation islands on the leadframe. It is further desirable to reduce processing costs.

Up until now, as shown in FIGS. 1A and 1B, logic chips and power chips may be connected to a leadframe. For example, a logic chip 101, shown in FIG. 1A as top chip, may be formed over a power chip 103, when connecting logic chips over a lead frame 105 in a housing. This arrangement may apply, for example, to a Cool MOS chip in a TO-220 housing. An isodrain 107, e.g. a metal (Cu)-ceramic-metal (Cu) sandwich, also called a double copper bonding (DCB) layer may be arranged between the chip, e.g. between power chip and the leadframe as shown in FIG. 1B.

FIGS. 2A to 2C show a chip-by-chip arrangement and an isodrain 107 (DCB) with an isolated power chip. FIGS. 2A and 2B show top views of a logic chip 101 disposed over a power chip 103 in an integrated circuit. FIG. 2C shows a side view of a realized DCB 107 between the power chip 103 and lead frame 105. Realization of the DCB metal-ceramic-metal sandwich may include complicated and expensive processes. One of the highest costs factors of the DCB is the double soft soldering process for the ceramic process, and even the connection of the ceramic to the chip back side. Furthermore, the design modifications adapted for each chip-dimension are lengthy and expensive.

SUMMARY

Various embodiments provide a chip arrangement, including a carrier; a first chip electrically connected to the carrier; a ceramic layer disposed over the carrier; and a second chip disposed over the ceramic layer; wherein the ceramic layer has a porosity in the range from about 3% to about 70%.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the invention. In the following description, various embodiments of the invention are described with reference to the following drawings, in which:

FIGS. 2A to 2C show a multi-chip package.

DETAILED DESCRIPTION

The following detailed description refers to the accompanying drawings that show, by way of illustration, specific details and embodiments in which the invention may be practiced.

The word "exemplary" is used herein to mean "serving as an example, instance, or illustration". Any embodiment or design described herein as "exemplary" is not necessarily to be construed as preferred or advantageous over other embodiments or designs.

The word "over" is used herein to describe forming a feature, e.g. a layer, "over" a side or surface, and may be used to mean that the feature, e.g. the layer may be formed "directly on," e.g. in direct contact with, the implied side or surface. The word "over" may also be used herein to describe forming a feature, e.g. a layer "over" a side or surface, and may be used to mean that the feature, e.g. the layer may be formed "indirectly on" the implied side or surface with one or more additional layers being arranged between the implied side or surface and the formed layer.

Various embodiments provide a method for manufacturing a chip arrangement. The method may include selectively depositing thin layers of different porosity over one another to electrically insulate a chip, e.g. a logic chip, in a multi-chip module.

Various embodiments provide a chip arrangement including one or more ceramic or plastic layers and/or one or more overlying electrically conductive layers over the ceramic or plaster layers, wherein the one or more layers may electrically insulate and/or dissipate heat from a chip, e.g. a logic chip, in a multi-chip module.

Various embodiments provide a method for manufacturing a multi-chip module using a particles deposition process e.g. a plasma dust method, for manufacturing one or more layers for heat dissipation and to electrically insulate a chip, e.g. a logic chip, in a multi-chip module.

Various embodiments provide a chip package, e.g. a single chip or multi-chip package, including one or more chips within a semiconductor housing, wherein a ceramic material including an organic materials, e.g. a purely organic material, may be used for heat dissipation.

Figure 1A:
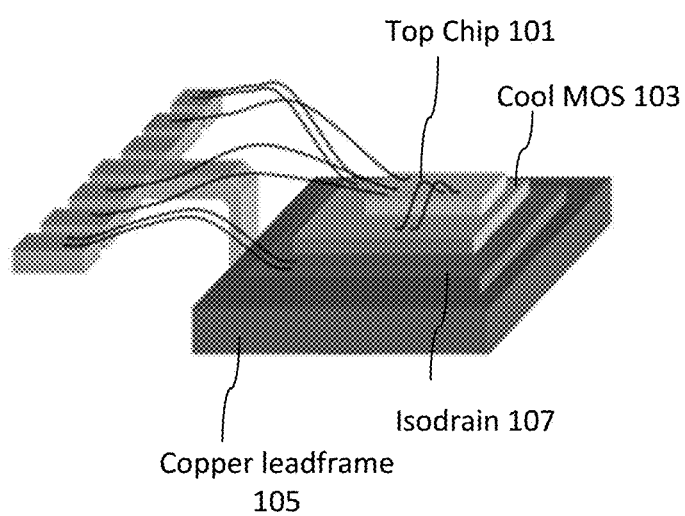
FIGS. 1A and 1B show a multi-chip package.
Figure 1B:
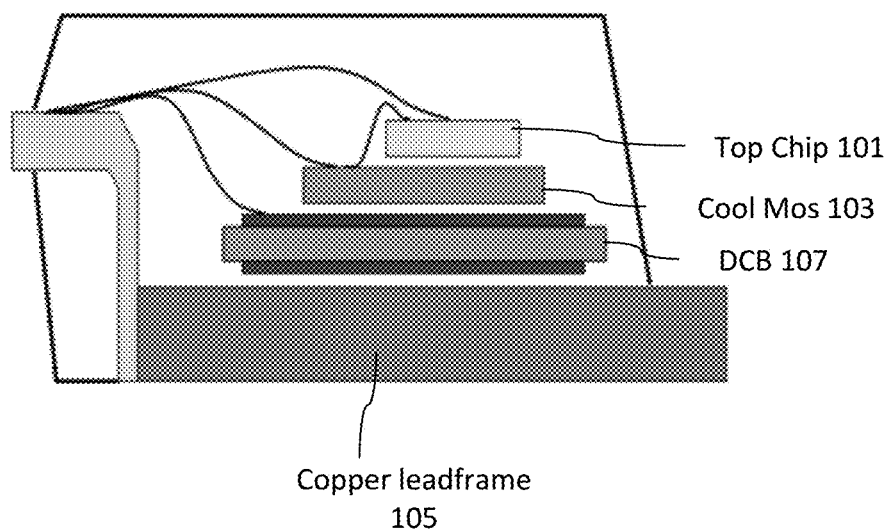
Figure 3:
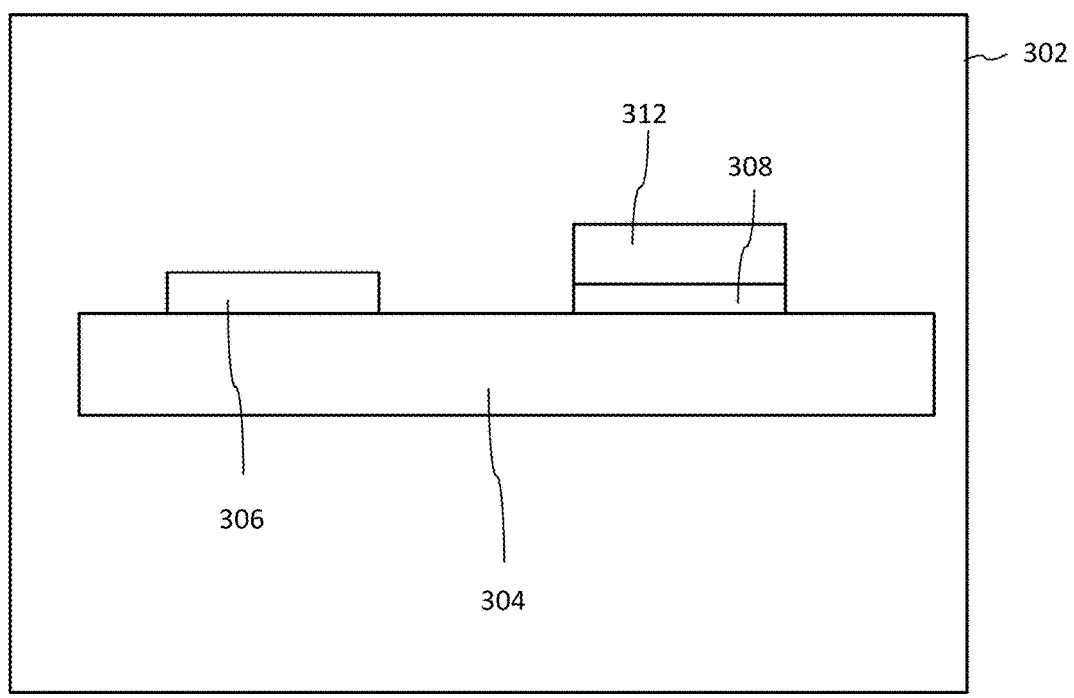
FIG. 3 shows a chip arrangement according to an embodiment.

FIG. 3 shows chip arrangement 302 according to an embodiment.

Chip arrangement 302, e.g. a chip package, may include carrier 304. Chip arrangement 302 may include first chip 306 electrically connected to carrier 304; ceramic layer 308 disposed over carrier 304; and second chip 312 disposed over ceramic layer 308; wherein ceramic layer 308 has a porosity in the range from about 3% to about 70%.

Figure 4:
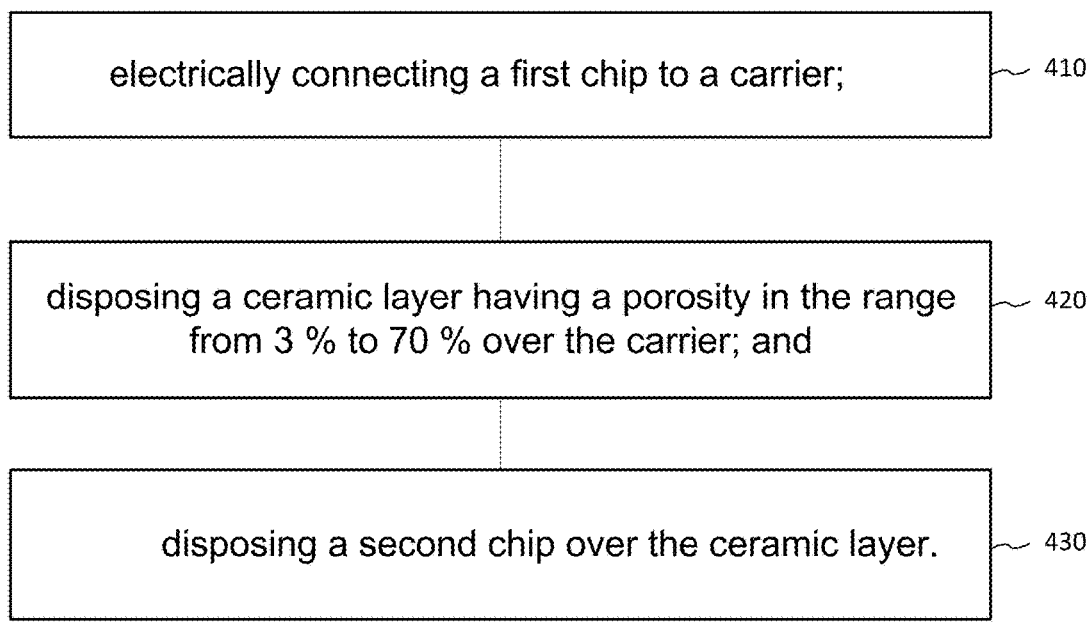
FIG. 4 shows a method for manufacturing a chip arrangement according to an embodiment.

FIG. 4 shows method 400 for manufacturing a chip arrangement, such as chip arrangement 302, according to various embodiments.

Method 400 may include:

electrically connecting a first chip to a carrier (in 410);

disposing a ceramic layer having a porosity in the range from about 3% to about 70% over the carrier (in 420); and disposing a second chip over the ceramic layer (in 430).

FIGS. 5A to 5E show method 500 for manufacturing a chip arrangement, such as chip arrangement 302, according to various embodiments.

Figure 5A:
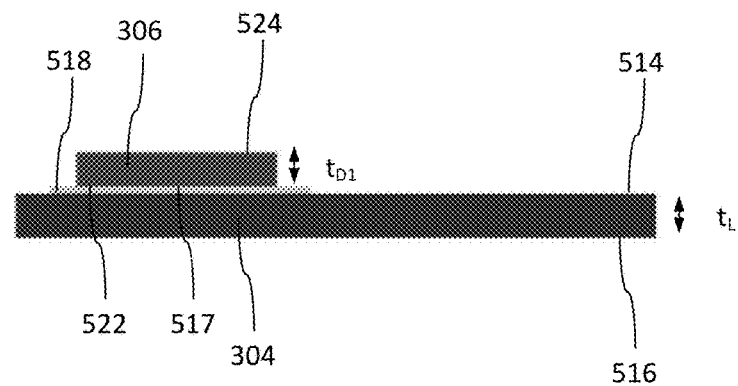
FIGS. 5A to 5E show a method for manufacturing a chip arrangement according to an embodiment.

As shown in FIG. 5A, method 500 may include electrically connecting first chip 306 to carrier 304. Carrier 304 may include a chip carrier. For example, carrier 304 may include an electrically conductive plate and/or substrate. Carrier 304 may include a lead frame, the lead frame including at least one from the following group of materials, the group of materials consisting of: copper, nickel, iron, copper alloy, nickel alloy, iron alloy.

Carrier 304 may have a thickness $t_L$ ranging from about 80 µm to about 1500 µm, e.g. about 100 µm to about 500 µm, e.g. about 120 µm to about 200 µm.

First chip 306, e.g. a semiconductor chip, e.g. a semiconductor die, may be disposed over carrier top side 514. Carrier 304 may include carrier bottom side 516, wherein carrier bottom side 516 faces a direction opposite to the direction faced by carrier top side 514.

First chip 306 may have a thickness $t_{D1}$ ranging from about 20 µm to about 450 µm, e.g. about 20 µm to about 250 µm, e.g. about 40 µm to about 60 µm.

First chip 306 may be electrically connected to carrier 304 via electrically conductive medium 518, e.g. a die attach material. Electrically conductive medium 518 may include at least one from the following group of materials, the group consisting of: a solder, a soft solder, a diffusion solder, a paste, a nanopaste, an adhesive, an electrically conductive adhesive, a thermally conductive adhesive. Electrically conductive medium 518 may include at least one from the following group of elements, the group of elements consisting of: Ag, Zn, Sn, Pb, Bi, In, Cu, Au, Ni.

Optionally, no other layers may be arranged between first chip 306 and carrier 304, apart from electrically conductive medium 518 which adheres first chip 306 to carrier 304, first chip 306 may then be understood to be formed directly on carrier 304.

Electrically conductive medium 518 may be configured to adhere first chip bottom side 522 to carrier top side 514. First chip 306 may include first chip top side 524 wherein first chip top side 524 may face a direction opposite to the direction that first chip bottom side 522 faces. First chip 306 may include chip back side metallization layer 517, which may also be referred to as a back side contact pad, formed over chip bottom side 522. Chip back side metallization layer 517 of first chip 306 may be adhered to carrier 304 via electrically conductive medium 518.

First chip 306 may include a power semiconductor chip, e.g. devices capable of carrying a voltage ranging from about 20 V to about 5000 V, e.g. from about 100 V to about 3000 V, e.g. from about 500 V to about 1500 V.

The power semiconductor chip may include at least one power semiconductor device from the group consisting of: a power transistor, a power MOS transistor, a power bipolar transistor, a power field effect transistor, a power insulated gate bipolar transistor, a thyristor, a MOS controlled thyristors, a silicon controlled rectifier, a power schottky diode, a silicon carbide diode, a gallium nitride device.

Top side may also be referred to as a "first side", "front side" or "upper side" of the chip. The terms "top side", "first side", "front side" or "upper side" may be used interchangeably hereinafter. Bottom side may also be referred to as "second side" or "back side" of the chip. The terms "second side", "back side", or "bottom side" may be used interchangeably hereinafter.

As used herein with respect to semiconductor power devices, the terms "top side", "first side", "front side" or "upper side" may be understood to refer to the side of the chip wherein a gate region and at least one first source/drain region may be formed. The terms "second side", "back side", or "bottom side" may be understood to refer to the side of the chip wherein a second source/drain region, e.g. chip back side metallization 517, may be formed. Therefore, a semiconductor power transistor may support a vertical current flow through the chip, e.g. between first chip top side 524 and first chip bottom side 522.

Figure 5B:
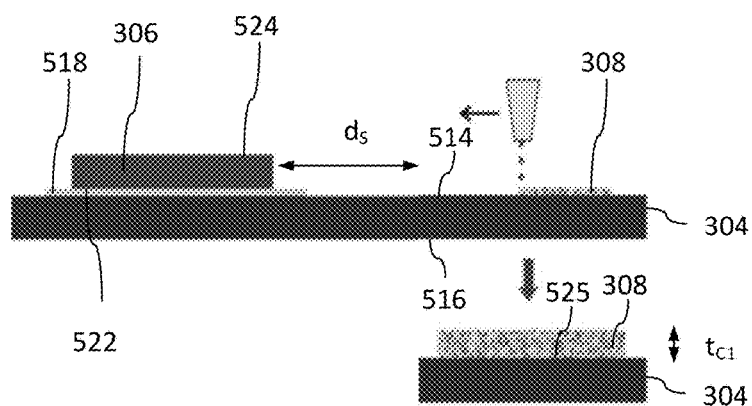

In FIG. 5B, ceramic layer 308 may be disposed over carrier 304. Ceramic layer 308 may be disposed over carrier top side 514. First chip 306 may already be disposed over carrier 304 before ceramic layer 308 is deposited. Alternatively, first chip 306 may not yet be disposed over carrier 304 when ceramic layer 308 is deposited. If first chip 306 may already be disposed over carrier 304 before ceramic layer 308 is deposited, ceramic layer 308 may be deposited over a region of carrier 304 disposed apart from first chip 306 by a separation distance $d_s$. Separation distance $d_s$ may define an eventual distance separating first chip 306 from second chip 312 formed over carrier 304, independently of which of first chip 306 and second chip 312 is formed over carrier 304 first. Separation distance $d_s$ may range from about 10 µm to about 10 mm, e.g. from about 50 µm to about 5 mm, e.g. from about 100 µm to about 1 mm.

Ceramic layer 308 may have a thickness $t_{C1}$ ranging from about 40 µm to about 300 µm, e.g. about 45 µm to about 150 µm, e.g. about 50 µm to about 100 µm.

The process of depositing ceramic layer 308 may include using a plasma dust method to deposit one or more particles, or any other suitable particle deposition method, e.g. a cold spray method, e.g. a thermal spray method.

The deposition of ceramic layer 308 may include depositing ceramic layer 308 which may include one or more particles, wherein the one or more particles may include at least one from the following group of materials, the group of materials consisting of: glass, aluminum oxide and aluminum nitride, silicon dioxide, silicon nitride, silicon carbide, titanium dioxide, titanium nitride, zirconium dioxide, boron nitride, boron carbide.

Ceramic layer 308 may further include at least one from the following group of materials, the group of materials consisting of: an organic material, plastic, epoxy, polyimide, thermoset, polyacrylate, silicone and silica.

For example, ceramic layer 308 may be deposited wherein one or more particles including at least one from the following group of materials, the group of materials consisting of: glass, aluminum oxide and aluminum nitride may be deposited on carrier 304. Subsequently at least one from the following group of materials, the group of materials consisting of: plastic, epoxy, polyimide, thermoset, polyacrylate, silicone and silica may be deposited to fill one or more spaces between the one or more particles and penetrates or inter diffuse inside the porous ceramic layer.

Heating of ceramic layer 308 may be carried out and the one or more particles may be sintered, causing them to adhere to carrier 304. The one or more particles may be heated up to temperatures in the range of about 20° C. to about 150° C. to cause sintering of particles. The sintering temperatures are lower than those used for current solder treatments. The basic adhesion mechanism may be dominantly chemical and/or physical adhesion.

Ceramic layer 308 may include a first portion, e.g. a filler portion, wherein the first portion may include one or more particles including at least one from the following group of materials, the group of materials consisting of: glass, aluminum oxide and aluminum nitride, silicon dioxide, silicon nitride, silicon carbide, titanium dioxide, titanium nitride, zirconium dioxide, boron nitride, boron carbide. Theses one or more particles may include ceramic materials. Ceramic layer 308 may include a second portion, e.g. a matrix portion, wherein the second portion includes at least one from the following group of materials, the group of materials consisting of: an organic material, plastic, epoxy, polyimide, thermoset, polyacrylate, silicone, silica.

Ceramic layer 308 may have a porosity in the range from about 3% to about 70%, e.g. about 10% to about 50%, e.g. about 20% to about 30%. Porosity may refer to the percentage of the total volume of ceramic layer 308 which may be taken up by voids, e.g. spaces. The voids may be spaces which are occupied by air.

Figure 7:
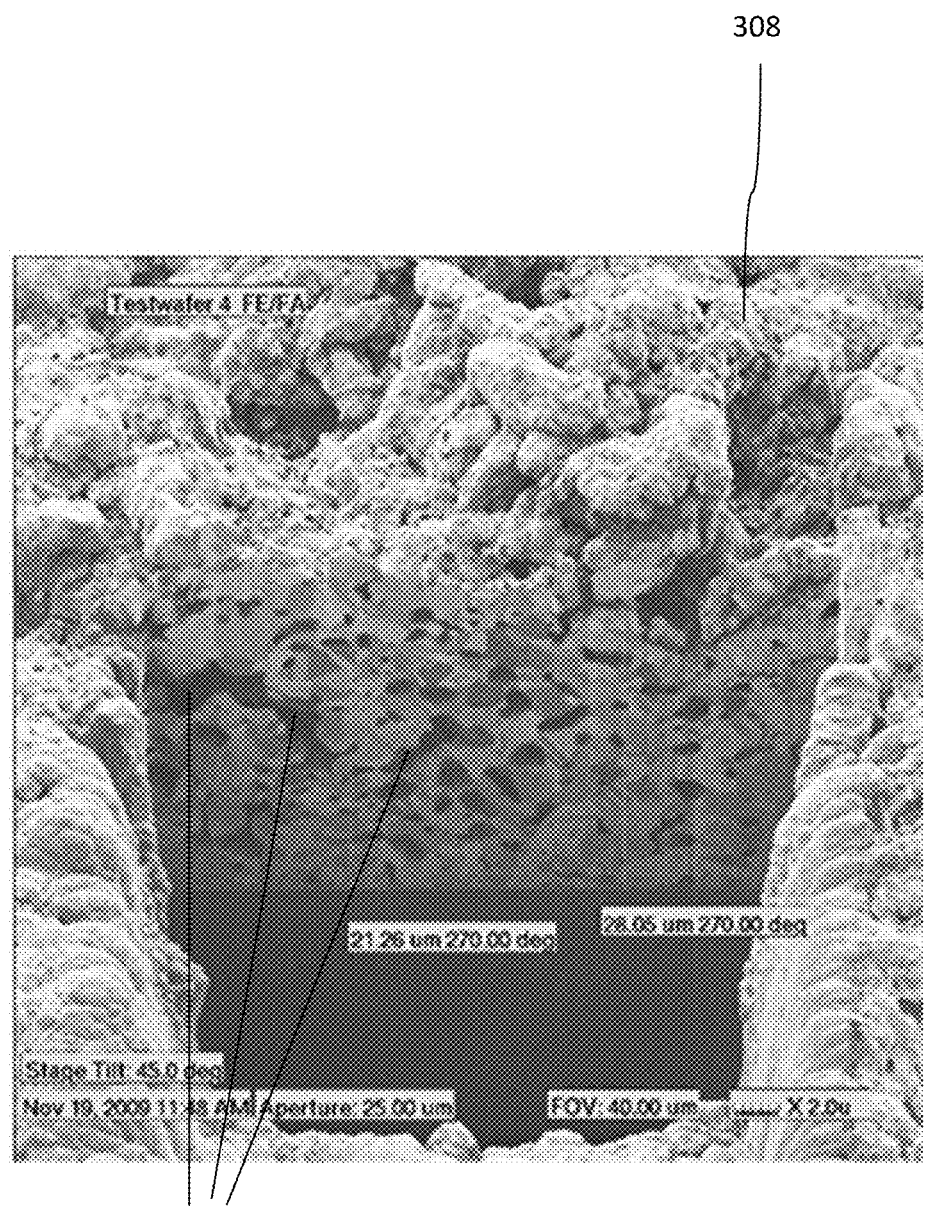
FIG. 7 shows a chip arrangement according to an embodiment.

FIG. 7 shows an image of a typical coating layer formed using plasma dust deposition. Ceramic layer 308 may be expected to include thermally conducting particles which may be deposited using plasma dust deposition, wherein the thermally conducting particles may be surrounded by electrically insulating material. As apparent from FIG. 7, one or more voids or spaces 748 may occupy the total volume of ceramic layer 308; the voids or spaces 748 thereby affecting or contributing to the porosity of ceramic layer 308.

Ceramic layer 308 may include at least one of an electrically insulating material, e.g. the matrix portion or second portion, and a thermally conducting material, e.g. the first portion, or filler portion. Ceramic layer 308 may exhibit electrically insulating properties and/or thermally conducting properties.

Ceramic layer 308 may be adhered directly on carrier 304 by means of an adhesive material 525. As no other layers may be arranged between ceramic layer 308 and carrier 304, apart from adhesive material 525 which adheres ceramic layer 308 to carrier 304, ceramic layer 308 may be understood to be formed directly on carrier 304. Alternatively, ceramic layer 308 may also be adhered to carrier 304 due to sintering which may cause ceramic layer 308, e.g. particles in ceramic layer 308 to adhere to carrier 304, even without adhesive material 525.

Although only one ceramic layer is shown in the diagrams, i.e. only ceramic layer 308 is shown, it may be possible, according to other embodiments, to have a plurality of ceramic layers 308 formed between carrier 304 and second chip 312. For example, the plurality of ceramic layers may each have different porosities from each other.

Figure 5C:
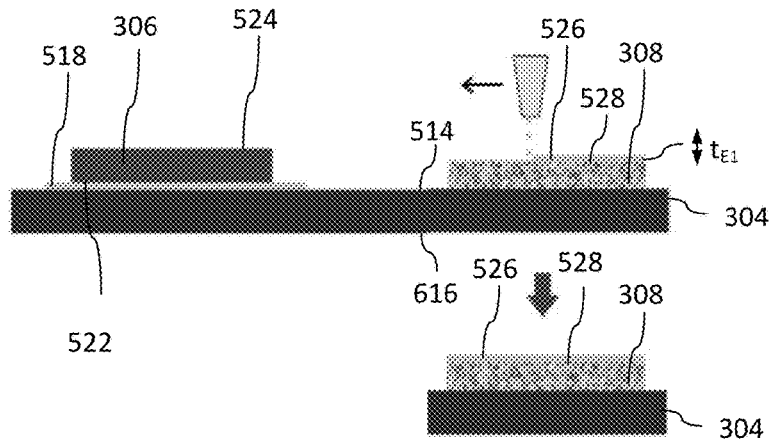

As shown in FIG. 5C, electrically conductive layer 526 may optionally be deposited. Electrically conductive layer 526 may be deposited over ceramic layer 308. Electrically conductive layer 526 may include metal. Electrically conductive layer 526 may include at least one from the following group of materials, the group of materials consisting of: tin, lead, silver, copper, nickel, palladium, zinc, and aluminum, gold, antimony, inorganic elements and organic element, may be optionally added. Electrically conductive layer 526 may include one or more particles, the one or more particles including at least one from the following group of materials, the group of materials consisting of: tin, lead, silver, copper, nickel, palladium, zinc, aluminum, gold, antimony, inorganic elements and organic element. Electrically conductive layer 526 may include one or more particles from the group of particles consisting of: structures, nanostructures, microstructures, nanoparticles, microparticles, fibers, nanofibers, microfibers.

Electrically conductive layer 526 may be deposited directly on ceramic layer 308. It may be understood that electrically conductive layer 526 may be therefore formed over carrier top side 514 wherein ceramic layer 308 may be between electrically conductive layer 526 and carrier 304. Electrically conductive layer 526 may be formed over, e.g. directly on, ceramic layer top side 528, wherein ceramic layer top side 528 may face the same direction as carrier top side 514.

Electrically conductive layer 526 may be deposited using a plasma dust method to deposit one or more particles, or any other suitable particle deposition method, e.g. cold spraying.

Electrically conductive layer 526 may have a thickness $t_{E1}$ ranging from about 100 µm to about 0.5 µm, e.g. about 50 µm to about 1 µm, e.g. about 30 µm to about 10 µm.

Figure 5D:
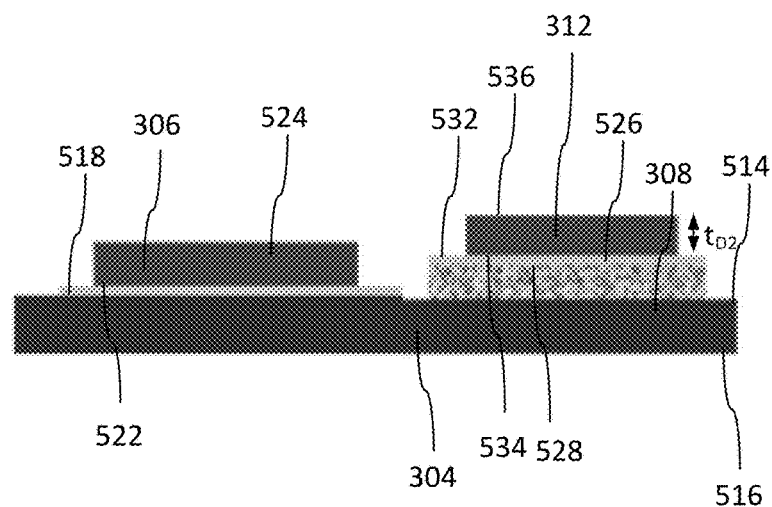

In FIG. 5D, second chip 312 may be disposed over ceramic layer 308. If electrically conductive layer 526 has been deposited over ceramic layer 308, then second chip 312 may be disposed over or directly on electrically conductive layer 526.

Second chip 312 e.g. a semiconductor chip, e.g. a semiconductor die, may include a semiconductor integrated circuit logic chip, wherein the semiconductor integrated circuit logic chip may include at least one semiconductor logic device from the group of semiconductor logic devices, the group consisting of: an application specific integrated chip (ASIC), a driver, a controller, and a sensor. It may be understood that a semiconductor logic chip i.e. a logic integrated circuit chip, may include a low power semiconductor device, e.g. devices capable of carrying up to 100 V to 150 V or less.

Second chip 312 may have a thickness $t_{D2}$ ranging from about 100 µm to about 300 µm, e.g. about 120 µm to about 250 µm, e.g. about 150 µm to about 200 µm.

Second chip 312 may optionally be adhered, e.g. glued, to electrically conductive layer 526 by means of adhesive material 532. Adhesive material 532 may include at least one of a solder, a soft solder, a diffusion solder, a paste, a nanopaste, an adhesive, an electrically conductive adhesive, a thermally conductive adhesive. According to another embodiment, adhesive material 532 may not be necessary. Electrically conductive layer 526 may itself include at least one of a solder, a soft solder, a diffusion solder, a paste, a nanopaste, an adhesive, an electrically conductive adhesive, a thermally conductive adhesive; thereby eliminating the need for adhesive material 532. In other words, second chip bottom side 534 may be adhered to ceramic layer 308 via electrically conductive layer 526. Therefore, electrically conductive layer 526 may itself include at least one of a solder, a soft solder, a diffusion solder, a paste, a nanopaste, an adhesive, an electrically conductive adhesive and/or a thermally conductive adhesive; formed from at least one from the following group of materials, the group consisting of: tin, lead, silver, copper, nickel, palladium, zinc, aluminum, gold, antimony, inorganic elements and organic element.

Second chip bottom side 534 may face a direction which carrier bottom side 516 faces. Second chip top side 536 may face a direction opposite to the direction which second chip bottom side 534 faces.

A temperature process, e.g. a sintering process may be carried out, wherein ceramic layer 308 may be sintered using the sintering process. Even though it may not be necessary that first chip 306 be already located over carrier 304 before ceramic layer 308 and second chip 312 are deposited, ceramic layer 308 may be sintered using a sintering process even wherein first chip 306 may already be located over, e.g. directly on, carrier 304. That is, the temperature process required for forming sintering of the particles in ceramic layer 308 may not place a thermal load on first chip 306 or second chip 312. Sintering may result in electrically conductive layer 526 being adhered, e.g. strongly adhered, to ceramic layer 308.

As used herein with respect to lower power semiconductor logic devices, second chip top side 536, may be understood to refer to the side of the chip which carries one or more contact pads, or electrical contacts, wherein bonding pads or electrical connects may be attached; or wherein it is the side of the chip which may be mostly covered by metallization layers. Second chip bottom side 534 may be understood to refer to the side of the chip which may be free from metallization or contact pads or electrical contacts.

It may be understood that second chip 312 may be electrically insulated from carrier 304. In other words, ceramic layer 308 and/or ceramic layer 308 in combination with electrically conductive layer 526, may electrically insulate second chip 312 from carrier 304. At the same time, ceramic layer 308 and/or ceramic layer 308 in combination with electrically conductive layer 526, may provide excellent heat dissipation qualities while electrically insulating second chip 312 from carrier 304.

Depositing at least one of ceramic layer 308 and at least one other electrically conductive layer, e.g. electrically conductive layer 526 and/or further electrically conductive layer 646, may allow second chip 312 to be connected to the lead frame. Using the plasma dust method, the thickness of at least one of ceramic layer 308 and at least one other electrically conductive layer, e.g. electrically conductive layer 526 and/or further electrically conductive layer 646 may be easily controlled. Using the plasma dust method, the thickness of the ceramic layer 308 may result in thin layers including ceramic or plastic, using the materials described already above.

Only a few processes are required to deposit at least one of ceramic layer 308 and at least one other electrically conductive layer, e.g. electrically conductive layer 526 and/or further electrically conductive layer 646. Therefore, the processing costs are low, while achieving electrical insulation of logic or MOSFET chips from a lead frame.

Figure 5E:
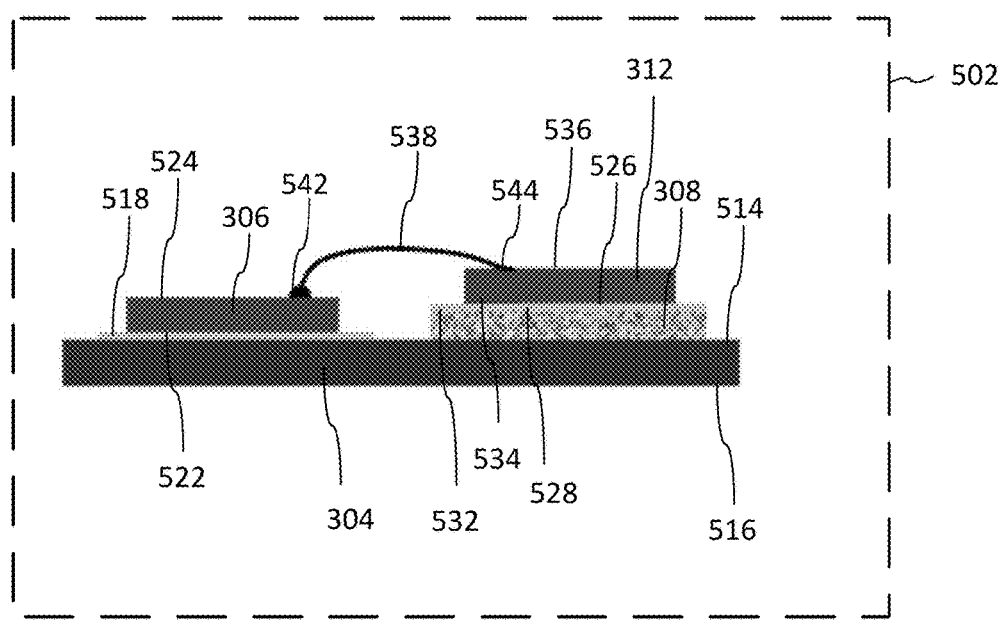

In FIG. 5E, first chip 306 maybe electrically connected to second chip 312 via one or more electrical interconnects 538. One or more electrical interconnects 538 may include at least one from the following group of electrical interconnects, the group consisting of: wires, electrically conductive wires, bond wires, clips, electrically conductive clips. One or more electrical interconnects 538 may include at least one material, element or alloy from the following group of materials, the group consisting of: copper, aluminum, silver, tin, gold, zinc, nickel. One or more electrical interconnects 538 may electrically connect one or more first chip contact pads 542 formed over first chip top side 524 to one or more second chip contact pads 544 formed over second chip top side 536. One or more first chip contact pads 542 and/or one or more second chip contact pads 544 may include at least one material, element or alloy from the following group of materials, the group consisting of: copper, aluminum, silver, tin, gold, zinc, nickel.

Apart from one or more electrical interconnects 538, second chip 312 may be isolated, e.g. electrically insulated from first chip 306. For example, second chip 312 may be packaged and/or partially surrounded with electrically insulating material, so that it is isolated from first chip 306. Furthermore, second chip 312 may be isolated from carrier 304 by means of ceramic layer 308 and/or electrically conductive layer 526. First chip 306, second chip 312 and one or more electrical interconnects 538 may be electrically connected wherein first chip 306 and second chip 312 may form a half-bridge circuit arrangement.

As a result of method 500, chip arrangement 502 may be formed. Chip arrangement 502 as shown in FIG. 5E, may include carrier 304. Chip arrangement 502 may include first chip 306 electrically connected to carrier 304; ceramic layer 308 disposed over carrier 304; and second chip 312 disposed over ceramic layer 308; wherein ceramic layer 308 has a porosity in the range from about 3% to about 70%.

Chip arrangement 502 may include a half bridge circuit arrangement including a power semiconductor chip, e.g. first chip 306, and a controller chip, e.g. second chip 312, arranged within a module.

Figure 6:
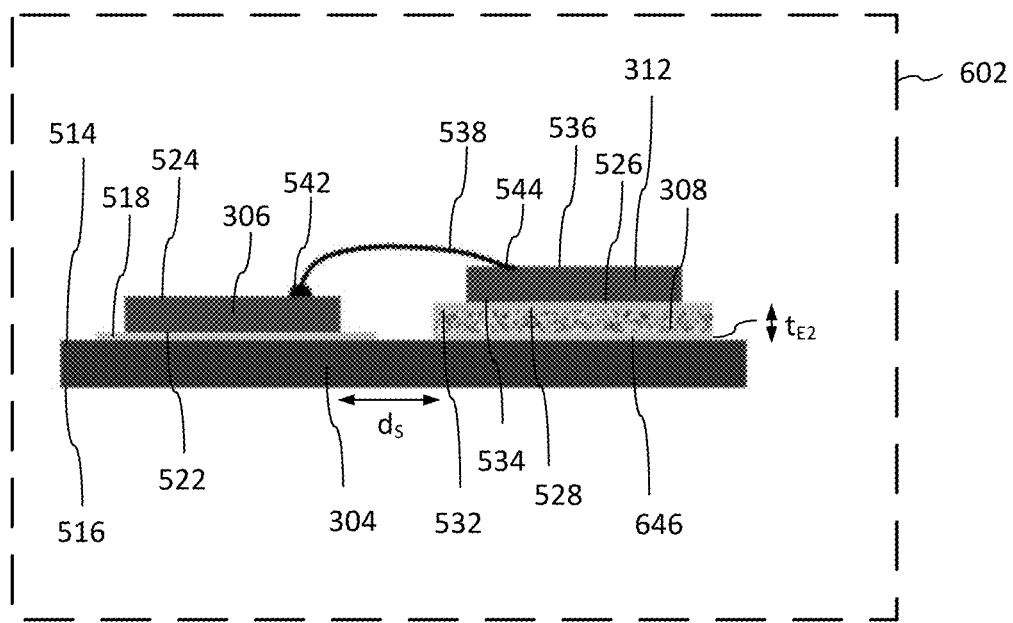
FIG. 6 shows a chip arrangement according to an embodiment.

FIG. 6 shows a chip arrangement 602 according to another embodiment. Chip arrangement 602 may include one or more or all of the features already described with respect to chip arrangement 502. According to another embodiment, an additional process may optionally be carried out, wherein further electrically conductive layer 646 may be deposited over e.g. directly on, carrier 304, before deposition of ceramic layer 308. If first chip 306 may already be located on carrier 304 before further electrically conductive layer 646 is deposited, further electrically conductive layer 646 may be deposited over a region of carrier 304 disposed apart from first chip 306 by a separation distance $d_s$, wherein separation distance $d_s$ as previously described, may define an eventual distance separating first chip 306 from second chip 312 formed over carrier 304. Further electrically conductive layer 646 may include one or more or all of the features already described with respect to electrically conductive layer 526.

At least one of ceramic layer 308 and at least one other electrically conductive layer, e.g. electrically conductive layer 526 and/or further electrically conductive layer 646 may be deposited through spin deposition, e.g. spinning coating of particles. The particles may include particles in the micrometer range and/or in the nanometer range. The particles may eventually be combined with a subsequent temperature process, e.g. a sintering process described hereinafter.

Electrically conductive layer 526 and/or further electrically conductive layer 646 may include but are not limited to including copper. Similarly to electrically conductive layer 526, further electrically conductive layer 646 may include one or more particles, the one or more particles including at least one from the following group of materials, the group of materials consisting of: tin, lead, silver, copper, nickel, palladium, zinc, aluminum, gold, antimony, inorganic elements and organic element.

Further electrically conductive layer 646 may be adhered to carrier 304 by means of an adhesive such as adhesive 532.

Alternatively, further electrically conductive layer 646 may free of bonding material, e.g. free of adhesives, e.g. free of glue. For example, further electrically conductive layer 646 may include at least one of a solder, a soft solder, a diffusion solder, a paste, a nanopaste, an adhesive, an electrically conductive adhesive, a thermally conductive adhesive formed from at least one from the following group of materials, the group consisting of: tin, lead, silver, copper, nickel, palladium, zinc, aluminum, gold, antimony, inorganic elements and organic element.

Further electrically conductive layer 646 may have a thickness $t_{E2}$ ranging from about 100 µm to about 0.5 µm, e.g. about 50 µm to about 1 µm, e.g. about 30 µm to about 10 µm.

Processes, for example, as described with respect to processes 410 to 430, and/or as described with respect to FIGS. 5B to 5E may then subsequently be carried out. As described in 420 and FIG. 5B, ceramic layer 308 may be deposited over carrier 304, and even directly on further electrically conductive layer 646. The adhesion of second chip 312 to ceramic layer 308 may take place using a single process, e.g. wherein sintering and/or soldering may be carried out approximately at the same time, e.g. simultaneously, wherein electrically conductive layer 526 and/or further electrically conductive layer 646 may be fixed to ceramic layer 308.

Ceramic layer 308 and/or ceramic layer 308 in combination with electrically conductive layer 526 and/or further electrically conductive layer 646, may electrically insulate second chip 312 from carrier 304. At the same time, ceramic layer 308 and/or ceramic layer 308 in combination with electrically conductive layer 526 and/or further electrically conductive layer 646, may provide excellent heat dissipation qualities while electrically insulating second chip 312 from carrier 304. Ceramic layer 308 and/or ceramic layer 308 in combination with electrically conductive layer 526 and/or further electrically conductive layer 646 may have a thermal conductivity in the range of 1 W/(m·K) to about 400 W/(m·K).

Chip arrangement 602 may include at least part of a chip package, e.g. a chip packaging module. Chip arrangement 602 may include carrier 304. Chip arrangement 602 may include first chip 306 electrically connected to carrier 304; further electrically conductive layer 646 disposed over carrier 304, ceramic layer 308 disposed over further electrically conductive layer 646; and second chip 312 disposed over ceramic layer 308; wherein ceramic layer 308 has a porosity in the range from about 3% to about 70%.

According to various embodiments, chip arrangement 602 may include a sandwich layer arrangement, e.g. copper 524-ceramic 308-copper 646 sandwich arrangement, between second chip bottom side 534 and carrier 304, wherein second chip 312 may be disposed over the sandwich layer arrangement. Further electrically conductive layer 646, i.e. second copper layer, may be disposed between carrier 304, i.e. the leadframe, and ceramic layer 308.

At least one of electrically conductive layer 526 and further electrically conductive layer 646 may serve as a solder material, e.g. as a soft solder, e.g. as a diffusion solder material.

At least one of electrically conductive layer 526 and further electrically conductive layer 646 may be not necessarily required. Alternatively, ceramic layer 304 may be adhered to carrier 304 by adhesive material, e.g. an electrically insulating adhesive, e.g. an electrically conductive adhesive, an epoxy, a glue, a paste, an adhesive foil, an adhesive film.

First chip 306 and second chip 312 may each include a semiconductor chip, e.g. a semiconductor die. First chip 306 and second chip 312 may each include a semiconductor chip, e.g. a die, which includes a wafer substrate. The semiconductor chip may include one or more electronic components formed over the wafer substrate. The wafer substrate may include various materials, e.g. semiconductor materials. The wafer substrate may include at least one from the following group of materials, the group of materials consisting of: Silicon, Germanium, Group III to V materials, polymers. According to an embodiment, the wafer substrate may include doped or undoped silicon. According to another embodiment, the wafer substrate may include a silicon on insulator SOI wafer. According to an embodiment, the wafer substrate may include a semiconductor compound material, e.g. gallium arsenide (GaAs), indium phosphide (InP). According to an embodiment, the wafer substrate may include a quaternary semiconductor compound material, e.g. indium gallium arsenide (InGaAs).

It may be understood that separation distance $d_s$ may define a distance separating first chip 306 from second chip 312 formed over carrier 304. In other words, first chip 306 may be formed over a first portion of carrier 304, second chip 312 may be formed over a second portion of carrier 304, wherein first portion of carrier 304 may be different from second portion of carrier 304. It may also be understood that first portion of carrier 304 may be separated from second portion of carrier 304 by separation distance $d_s$. It may be understood therefore that first chip 306 may be formed over a first portion of carrier 304, and at least one of ceramic layer 308 and/or at least one other electrically conductive layer, e.g. electrically conductive layer 526 and/or further electrically conductive layer 646, may be formed over a second portion of carrier 304 wherein first portion of carrier 304 may be different from second portion of carrier 304, i.e. first portion of carrier 304 may be separated from second portion of carrier 304 by separation distance $d_s$.

Various embodiments provide a method for manufacturing a chip arrangement needing a simplified set of deposition equipment, e.g. only one apparatus, to process and produce an electrically insulating medium, e.g. at least one of ceramic layer 308 and at least one other electrically conductive layer, e.g. electrically conductive layer 526 and/or further electrically conductive layer 646.

Various embodiments provide a chip arrangement and method for manufacturing a chip arrangement which incurs low production costs and low processing costs, e.g. reduction in cost by at least a factor of 10 to 15.

Various embodiments provide a chip arrangement and method for manufacturing a chip arrangement wherein materials may be easily changed, and adapted for specific designs on the chip arrangement, and wherein the method provides flexibility for adapting and changing materials to be used as layer components in the chip arrangement.

Various embodiments provide a chip arrangement and method for manufacturing a chip arrangement requiring simple preparation of materials and/or material compositions, in order to easily improve layer functionalities. Examples of such material compositions may include, e, g. depositing solder material in electrically conductive layer 526 and/or further electrically conductive layer 646, which may each include copper. Further examples include mixing glass and/or ceramic filler particles with plastic and/or epoxy to form ceramic layer 308. Further examples include mixing a polymer matrix into ceramic layer 308.

Various embodiments provide a chip arrangement and method for manufacturing a chip arrangement wherein layer thicknesses, e.g. thicknesses of at least one of ceramic layer 308 and at least one other electrically conductive layer, e.g. electrically conductive layer 526 and/or further electrically conductive layer 646, may be easily varied during the time of the coating process.

Various embodiments provide a chip arrangement and method for manufacturing a chip arrangement wherein at least one of ceramic layer 308 and at least one other electrically conductive layer, e.g. electrically conductive layer 526 and/or further electrically conductive layer 646, may be produced by a process which places little or no thermal load on first chip 306 and/or second chip 312 during the process, e.g. using a cold coating process, e.g. a cold spray process.

Various embodiments provide a method for manufacturing a chip arrangement wherein fast design changes are possible, e.g. by varying the nozzle of the deposition equipment, e.g. through programming the coating nozzle.

Various embodiments provide a method for manufacturing a chip arrangement wherein the location of at least one of ceramic layer 308 and at least one other electrically conductive layer, e.g. electrically conductive layer 526 and/ or further electrically conductive layer 646, i.e. the location of the isolation islands, may be exactly placed over carrier 304.

Various embodiments provide a method for manufacturing a chip arrangement wherein problems with running of solder material may be avoided, therefore eliminating the danger of short circuits within the chip arrangement.

Various embodiments provide a method for depositing solder layers over ceramic materials, e.g. over ceramic material 308, e.g. directly on ceramic material 308.

Various embodiments provide a chip arrangement, including: a carrier; a first chip electrically connected to the carrier; a ceramic layer disposed over the carrier; and a second chip disposed over the ceramic layer; wherein the ceramic layer has a porosity in the range from 3% to 70%.

According to an embodiment, the first chip includes a power semiconductor chip.

According to an embodiment, the power semiconductor chip includes at least one power semiconductor device from the group consisting of: a power transistor, a power MOS transistor, a power bipolar transistor, a power field effect transistor, a power insulated gate bipolar transistor, a thyristor, a MOS controlled thyristors, a silicon controlled rectifier, a power schottky diode, a silicon carbide diode, a gallium nitride device.

According to an embodiment, the second chip includes at least one of a semiconductor logic chip and a semiconductor memory chip.

According to an embodiment, the semiconductor logic chip includes at least one semiconductor logic device from the group consisting of: an application specific integrated circuit, a driver, a controller, a sensor.

According to an embodiment, a first chip side is electrically connected to the carrier via an electrically conductive medium.

According to an embodiment, the electrically conductive medium includes at least one from the following group of materials, the group consisting of: a solder, a soft solder, a diffusion solder, a paste, a nanopaste, an adhesive, an electrically conductive adhesive and a thermally conductive adhesive.

According to an embodiment, the ceramic layer is adhered directly on the carrier by means of an adhesive material.

According to an embodiment, the ceramic layer includes at least one of an electrically insulating material and a thermally conducting material.

According to an embodiment, the ceramic layer includes one or more particles, the one or more particles including at least one from the following group of materials, the group of materials consisting of: aluminum oxide and aluminum nitride, silicon dioxide, silicon nitride, silicon carbide, titanium dioxide, titanium nitride, zirconium dioxide, boron nitride, boron carbide.

According to an embodiment, the ceramic layer further includes a filler material, the filler material including at least one from the following group of materials, the group of materials consisting of: an organic material, plastic, epoxy, polyimide, thermoset, polyacrylate, silicone and silica.

According to an embodiment, the carrier includes an electrically conductive material.

According to an embodiment, the carrier includes a lead frame, the lead frame including at least one from the following group of materials, the group of materials consisting of: copper, nickel, iron, silver, gold, palladium, phosphorus, copper alloy, nickel alloy, iron alloy, silver alloy, gold alloy, palladium alloy, phosphorus alloy.

According to an embodiment, the chip arrangement further includes an encapsulation material disposed over the carrier, wherein the encapsulation material at least partially surrounds the first chip and the second chip, and one or more lateral sides of the carrier.

According to an embodiment, the chip arrangement further includes at least one electrically conductive layer formed at least one of over and under the ceramic layer.

According to an embodiment, the at least one electrically conductive layer includes at least one from the following group of materials, the group of materials consisting of: tin, lead, silver, copper, nickel, palladium, zinc, aluminum, gold, antimony, inorganic elements and organic elements.

Various embodiments provide a method for manufacturing a chip arrangement, the method including: electrically connecting a first chip to a carrier; disposing a ceramic layer having a porosity in the range from 3% to 70% over the carrier; and disposing a second chip over the ceramic layer.

According to an embodiment, the method includes adhering the ceramic layer directly on the carrier by means of an adhesive material.

According to an embodiment, the ceramic layer includes at least one of an electrically insulating material and a thermally conducting material.

According to an embodiment, the ceramic layer includes one or more particles, the one or more particles including at least one from the following group of materials, the group of materials consisting of: aluminum oxide and aluminum nitride, silicon dioxide, silicon nitride, silicon carbide, titanium dioxide, titanium nitride, zirconium dioxide, boron nitride, boron carbide.

According to an embodiment, the carrier includes a lead frame, the lead frame including at least one from the following group of materials, the group of materials consisting of: copper, nickel, iron, silver, gold, palladium, phosphorus, copper alloy, nickel alloy, iron alloy, silver alloy, gold alloy, palladium alloy, phosphorus alloy.

According to an embodiment, the method further includes disposing an encapsulation material over the carrier, wherein the encapsulation material at least partially surrounds the first chip and the second chip, and one or more lateral sides of the carrier.

According to an embodiment, the method further includes forming at least one electrically conductive layer over the carrier before depositing the ceramic layer; and depositing the ceramic layer over the at least one electrically conductive layer.

According to an embodiment, the method further includes forming at least one electrically conductive layer over the ceramic layer; and forming the second chip over the least one electrically conductive layer.

According to an embodiment, the method further includes electrically connecting the first chip to the carrier via an electrically conductive medium including at least one material from the following group of materials, the group consisting of: a solder, a soft solder, a diffusion solder, a paste, a nanopaste, an adhesive, an electrically conductive adhesive, a thermally conductive adhesive.

According to an embodiment, the first chip includes a power semiconductor chip.

According to an embodiment, the second chip includes at least one of a semiconductor logic chip and a semiconductor memory chip.

While the invention has been particularly shown and described with reference to specific embodiments, it should be understood by those skilled in the art that various changes in form and detail may be made therein without departing from the spirit and scope of the invention as defined by the appended claims. The scope of the invention is thus indicated by the appended claims and all changes which come within the meaning and range of equivalency of the claims are therefore intended to be embraced.

What is claimed is:

1. A method for manufacturing a chip arrangement, the method comprising:
   electrically connecting a first chip to a carrier;
   disposing a ceramic layer having a porosity in the range from 3% to 70% over the carrier by plasma-dust deposition;
   disposing at least one electrically conductive layer over the ceramic layer by plasma-dust deposition;
   sintering the chip arrangement to adhere the ceramic layer to the carrier and the at least one electrically conductive layer to the ceramic layer; and then
   disposing a second chip over the at least one electrically conductive layer.

2. The method according to claim 1, further comprising: adhering the ceramic layer directly on the carrier via an adhesive material.

3. The method according to claim 1, wherein the ceramic layer comprises an electrically insulating material.

4. The method according to claim 3, wherein the ceramic layer further comprises a thermally conducting material.

5. The method according to claim 1, wherein the ceramic layer comprises one or more particles with one or more spaces between the one or more particles.

6. The method according to claim 5, wherein the one or more particles comprise at least one from the following group of materials, the group of materials consisting of: aluminum oxide, aluminum nitride, silicon dioxide, silicon nitride, silicon carbide, titanium dioxide, titanium nitride, zirconium dioxide, boron nitride, boron carbide.

7. The method according to claim 5, further comprising: disposing an electrically insulating material over the ceramic layer that penetrates or interdiffuses inside the ceramic layer to fill the one or more spaces between the one or more particles.

8. The method according to claim 1, wherein the carrier comprises a lead frame, the lead frame comprising at least one from the following group of materials, the group of materials consisting of: copper, nickel, iron, silver, gold, palladium, phosphorous, copper alloy, nickel alloy, iron alloy, silver alloy, gold alloy, palladium alloy, phosphorous alloy.

9. The method according to claim 1, further comprising:
   disposing an encapsulation material over the carrier, wherein the encapsulation material at least partially surrounds the first chip and the second chip, and one or more lateral sides of the carrier.

10. The method according to claim 1, further comprising:
    electrically connecting the first chip to the carrier via an electrically conductive medium comprising at least one material from the following group of materials, the group consisting of: a solder, a soft solder, a diffusion solder, a paste, a nanopaste, an adhesive, an electrically conductive adhesive, a thermally conductive adhesive.

11. The method according to claim 1, wherein the first chip comprises a power semiconductor chip.

12. The method according to claim 1, wherein the second chip comprises a semiconductor logic chip or a semiconductor memory chip.

13. The method according to claim 1, wherein the sintering is at a temperature configured to prevent thermal load on the first chip connected to the carrier.

14. The method according to claim 1, wherein the sintering is at a temperature in a range from 20° C. to 150° C.

15. A method for manufacturing a chip arrangement, the method comprising:
    electrically connecting a first chip to a carrier;
    disposing a ceramic pad on the carrier at a separation distance from the first chip;
    disposing at least one electrically conductive layer over the ceramic pad;
    sintering the chip arrangement to adhere the ceramic pad to the carrier and the at least one electrically conductive layer to the ceramic layer; and
    disposing a second chip over the at least one electrically conductive layer.

16. The method of claim 15, further comprising:
    disposing at least one further electrically conductive layer directly over the carrier, wherein the ceramic pad is disposed over the at least one further electrically conductive layer and the sintering further adheres the at least one further electrically conductive layer to the carrier and the ceramic pad to the at least one further electrically conductive layer.

17. The method of claim 15, wherein the ceramic layer comprises one or more particles with one or more spaces between the one or more particles and prior to disposing the at least one electrically conductive layer over the ceramic pad, the method further comprising: disposing an electrically insulating material over the ceramic layer that penetrates or interdiffuses inside the ceramic layer to fill the one or more spaces between the one or more particles.

18. The method of claim 15, wherein the separation distance is in a range from 10 μm to 10 mm.

19. A method for manufacturing a chip arrangement, the method comprising:

electrically connecting a first chip to a carrier;
disposing at least one electrically conductive layer directly over the carrier by plasma-dust deposition before depositing a ceramic layer; then
disposing the ceramic layer having a porosity in the range from 3% to 70% directly over the at least one electrically conductive layer by plasma-dust deposition;
sintering the chip arrangement to adhere the at least one electrically conductive layer directly over the carrier and the ceramic layer to the carrier; and
disposing a second chip over the ceramic layer.

* * * * *